(12) United States Patent
Xu et al.

(10) Patent No.: US 11,404,313 B2
(45) Date of Patent: Aug. 2, 2022

(54) SELECTIVE TUNGSTEN DEPOSITION AT LOW TEMPERATURES

(71) Applicant: Applied Materials, Inc., Santa Clara, CA (US)

(72) Inventors: Yi Xu, San Jose, CA (US); Yufei Hu, Fremont, CA (US); Yu Lei, Belmont, CA (US); Kazuya Daito, Milipitas, CA (US); Da He, Santa Clara, CA (US); Jiajie Cen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 88 days.

(21) Appl. No.: 16/917,049

(22) Filed: Jun. 30, 2020

(65) Prior Publication Data

US 2020/0335395 A1    Oct. 22, 2020

Related U.S. Application Data

(60) Continuation-in-part of application No. 16/252,100, filed on Jan. 18, 2019, now Pat. No. 10,727,119, (Continued)

(51) Int. Cl.
*H01L 21/768* (2006.01)
*H01L 21/285* (2006.01)
(Continued)

(52) U.S. Cl.
CPC .. *H01L 21/76879* (2013.01); *H01L 21/28562* (2013.01); *H01L 21/76816* (2013.01);
(Continued)

(58) Field of Classification Search
None
See application file for complete search history.

(56) References Cited

U.S. PATENT DOCUMENTS

| 4,863,879 A | 9/1989 | Kwok |
| 5,529,953 A * | 6/1996 | Shoda ............... H01L 21/76844 438/644 |

(Continued)

FOREIGN PATENT DOCUMENTS

| KR | 20190039642 A | 4/2019 |
| WO | 2019142176 A1 | 7/2019 |

OTHER PUBLICATIONS

PCT International Search Report and Written Opinion in PCT/US2018/028036 dated Jan. 7, 2019, 10 pages.
(Continued)

*Primary Examiner* — Long Pham
(74) *Attorney, Agent, or Firm* — Servilla Whitney LLC

(57) ABSTRACT

Embodiments of the disclosure relate to methods of depositing tungsten. Some embodiments of the disclosure provide methods for depositing tungsten which are performed at relatively low temperatures. Some embodiments of the disclosure provide methods in which the ratio between reactant gasses is controlled. Some embodiments of the disclosure provide selective deposition of tungsten. Some embodiments of the disclosure provide methods for depositing tungsten films at a low temperature with relatively low roughness, stress and impurity levels.

18 Claims, 4 Drawing Sheets

Related U.S. Application Data which is a division of application No. 15/498,024, filed on Apr. 26, 2017, now Pat. No. 10,256,144.

(60) Provisional application No. 63/041,096, filed on Jun. 18, 2020.

(51) Int. Cl.
*H01L 23/532* (2006.01)
*H01L 23/522* (2006.01)

(52) U.S. Cl.
CPC .. *H01L 21/76831* (2013.01); *H01L 21/76834* (2013.01); *H01L 23/5226* (2013.01); *H01L 23/53209* (2013.01); *H01L 23/53214* (2013.01); *H01L 23/53228* (2013.01); *H01L 23/53257* (2013.01)

(56) References Cited

U.S. PATENT DOCUMENTS

| | | | |
|---|---|---|---|
| 6,964,922 B2 | 11/2005 | Lee et al. | |
| 7,208,415 B2 | 4/2007 | Lai et al. | |
| 8,900,999 B1* | 12/2014 | Wu | H01L 21/28079 438/685 |
| 9,236,292 B2 | 1/2016 | Romero et al. | |
| 9,721,887 B2 | 8/2017 | Peng | |
| 9,748,105 B2 | 8/2017 | Wu et al. | |
| 9,895,715 B2 | 2/2018 | Haukka et al. | |
| 10,014,213 B2 | 7/2018 | Yu et al. | |
| 10,157,786 B2 | 12/2018 | Haukka et al. | |
| 10,256,144 B2 | 4/2019 | Ren et al. | |
| 2002/0170891 A1 | 11/2002 | Boyle et al. | |
| 2003/0186539 A1 | 10/2003 | Lee et al. | |
| 2006/0003486 A1 | 1/2006 | Lai et al. | |
| 2009/0269507 A1 | 10/2009 | Yu et al. | |
| 2011/0244680 A1 | 10/2011 | Tohnoe et al. | |
| 2011/0244682 A1 | 10/2011 | Khandelwal et al. | |
| 2015/0170961 A1 | 6/2015 | Romero et al. | |
| 2015/0217330 A1 | 8/2015 | Haukka et al. | |
| 2017/0022609 A1* | 1/2017 | Knisley | C23C 16/45553 |
| 2017/0053864 A1 | 2/2017 | Peng et al. | |
| 2017/0069527 A1 | 3/2017 | Haukka et al. | |
| 2017/0100742 A1 | 4/2017 | Pore et al. | |
| 2017/0100743 A1 | 4/2017 | Pore et al. | |
| 2017/0110368 A1 | 4/2017 | Yu et al. | |
| 2017/0154806 A1 | 6/2017 | Wang et al. | |
| 2017/0323776 A1 | 11/2017 | Farm et al. | |
| 2018/0240676 A1* | 8/2018 | Chan | C23C 16/06 |
| 2020/0335395 A1 | 10/2020 | Xu et al. | |

OTHER PUBLICATIONS

PCT International Search Report and Written Opinion in PCT/US2021/039816 dated Oct. 21, 2021, 12 pages.

* cited by examiner

100

```
                    ┌─────────┐
                    │  Begin  │
                    └────┬────┘
                         ▼
        ┌──────────────────────────────────┐
        │  Deposit a dielectric barrier layer │ ~ 102
        └──────────────┬───────────────────┘
                       ▼
        ┌──────────────────────────────────┐
        │     Deposit a dielectric layer     │ ~ 104
        └──────────────┬───────────────────┘
                       ▼
┌──────────────────────────────────────────────────────────┐
│ Form one or more vias in the dielectric layer and the dielectric barrier layer │ ~ 106
└──────────────────────┬───────────────────────────────────┘
                       ▼
        ┌──────────────────────────────────────────┐
        │ Form one or more trenches in the dielectric layer │ ~ 108
        └──────────────┬───────────────────────────┘
                       ▼
┌──────────────────────────────────────────────────────────┐
│         Perform a pre-treatment process                  │ ~ 110
│                                                          │
│      ┌────────────────────────────────────────┐          │
│      │   Pre-treat exposed conductive layers  │ ~ 112    │
│      └──────────────┬─────────────────────────┘          │
│                     ▼                                    │
│      ┌────────────────────────────────────────┐          │
│      │       Pre-treat sidewalls of the via   │ ~ 114    │
│      └──────────────┬─────────────────────────┘          │
│                     ▼                                    │
│      ┌ ─ ─ ─ ─ ─ ─ ─ ─ ─ ─ ─ ─ ─ ─ ─ ─ ─ ─ ─ ┐          │
│      │     Post-treatment clean bottom of via  │ ~ 116   │
│      └ ─ ─ ─ ─ ─ ─ ─ ─ ─ ─ ─ ─ ─ ─ ─ ─ ─ ─ ─ ┘          │
└──────────────────────┬───────────────────────────────────┘
                       ▼
        ┌──────────────────────────────────┐
        │     Deposit a first metal layer    │ ~ 118
        └──────────────┬───────────────────┘
                       ▼
        ┌ ─ ─ ─ ─ ─ ─ ─ ─ ─ ─ ─ ─ ─ ─ ─ ─ ┐
        │ Optionally, perform a pre-clean process │ ~ 119
        └ ─ ─ ─ ─ ─ ─ ─ ─ ─ ─ ─ ─ ─ ─ ─ ─ ┘
                       ▼
        ┌──────────────────────────────────┐
        │    Deposit a second metal layer    │ ~ 120
        └──────────────┬───────────────────┘
                       ▼
                    ┌───────┐
                    │  End  │
                    └───────┘
```

FIG. 1

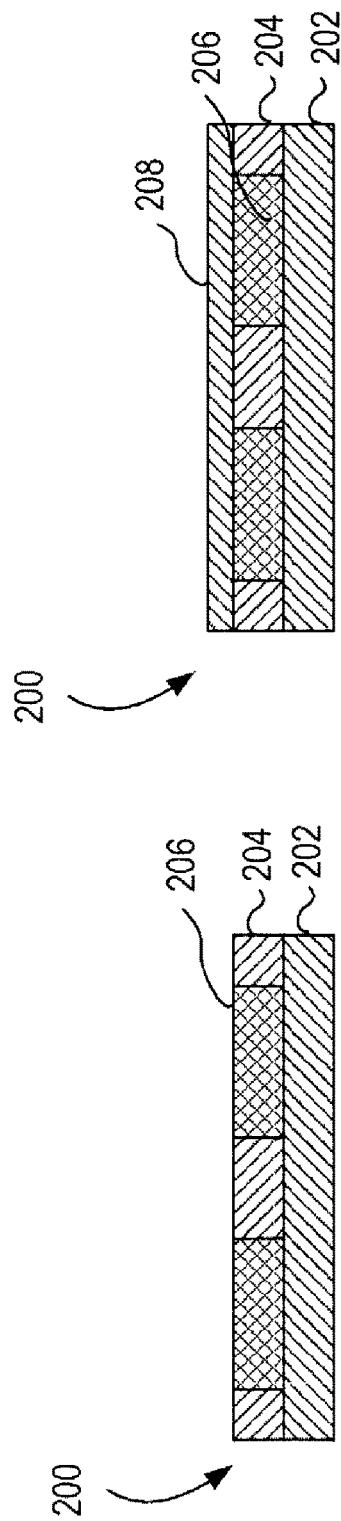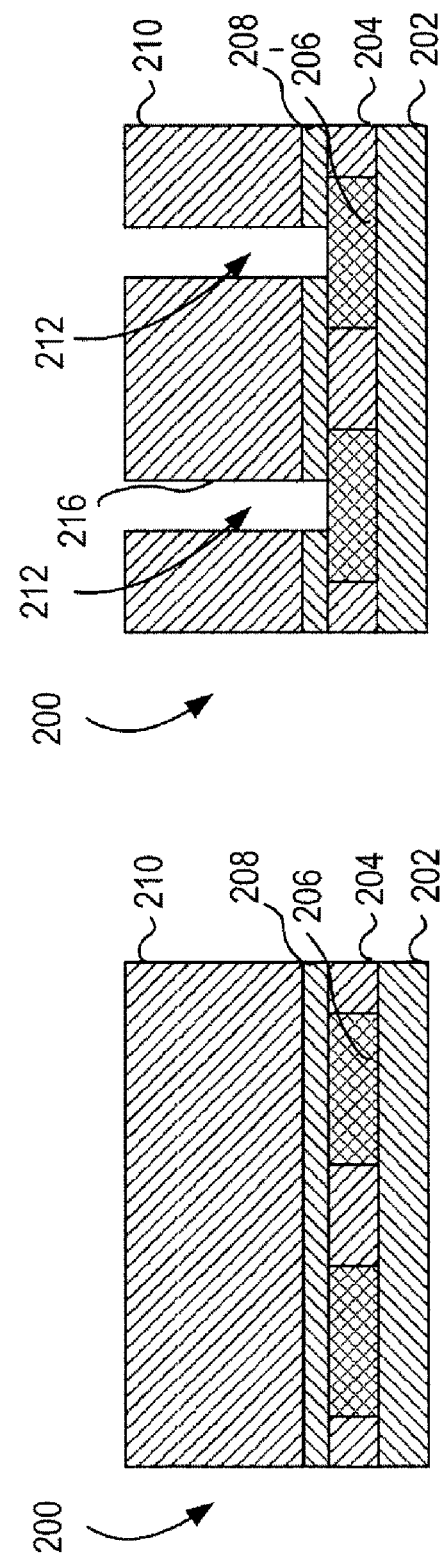

SELECTIVE TUNGSTEN DEPOSITION AT LOW TEMPERATURES

CROSS-REFERENCE TO RELATED APPLICATIONS

This application is a continuation-in-part application of U.S. application Ser. No. 16/252,100, filed Jan. 18, 2019, which is a divisional of U.S. application Ser. No. 15/498,024, filed Apr. 26, 2017, now issued as U.S. Pat. No. 10,256,144, issued on Apr. 9, 2019, and claims priority to U.S. Provisional Application Ser. No. 63/041,096, filed Jun. 18, 2020, all of which are incorporated by reference herein in their entirety.

TECHNICAL FIELD

Embodiments of the present disclosure generally relate to an improved method of forming interconnects. Further embodiments of the disclosure relate to methods of forming tungsten at low temperatures.

BACKGROUND

Reliably producing sub-100 nm and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As circuit densities increase for next generation devices, the widths of interconnects, such as vias, trenches, contacts, gate structures, and other features, as well as the dielectric materials therebetween, decrease to 45 nm and 32 nm dimensions or below, whereas the thickness of the dielectric layer remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. 3D stacking of semiconductor chips reduces wire lengths and keeps wiring delay low. In manufacturing, 3D stacking of semiconductor chips, stair-like structures are often utilized to allow multiple interconnection structures to be disposed thereon, forming high-density of vertical transistor devices.

Thus, there is a continual need for improved methods of forming interconnects to decrease the manufacturing costs, memory cell size, and power consumption of the integrated circuits.

Tungsten films deposited by chemical vapor deposition (CVD) are known to possess relatively high stress values roughness. Further, tungsten films deposited using tungsten hexafluoride are known to have relatively high levels of fluorine impurities. The relatively high levels of stress, roughness and fluorine impurities often causes problems, including, but not limited to, wafer bowing, structure deformation, voids and seams in gapfill and fluorine attack damage at interfaces.

Some of the methods which have been developed to counteract these problems rely on atomic layer deposition (ALD). Yet, the ALD methods are typically performed at relatively high temperatures, usually greater than or equal to 400° C.).

Accordingly, there is a need for methods of depositing tungsten which provide low roughness, low stress and low impurities which are also performed at lower temperatures.

SUMMARY

One or more embodiments of the disclosure are directed to a method of depositing tungsten. The method comprises exposing a substrate to a flow of hydrogen gas and exposing the substrate to a flow of a tungsten precursor while exposing the substrate to the flow of hydrogen gas to deposit a tungsten layer on the substrate, The substrate is maintained at a temperature of less than or equal to about 350° C.

Additional embodiments of the disclosure are directed to a method of depositing tungsten. The method comprises exposing a substrate to a flow of hydrogen gas and exposing the substrate to a flow of a tungsten precursor while exposing the substrate to the flow of hydrogen gas. A ratio of the flow of hydrogen gas to the flow of the tungsten precursor is greater than or equal to about 500:1.

Further embodiments of the disclosure are directed to a method of selectively depositing tungsten, The method comprises exposing a substrate comprising a first material surface and a second material surface to a flow of hydrogen gas and exposing the substrate to a flow of a tungsten precursor while exposing the substrate to the flow of hydrogen gas to deposit a first thickness of tungsten on the first material surface and a second thickness of tungsten on the second material surface. A ratio of the first thickness to the second thickness is greater than or equal to about 200:1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 illustrates a method of forming an interconnect, according to one or more embodiments;

FIGS. 2A-2G illustrate side cross-sectional views of an interconnect formed on a substrate at different stages of the method of FIG. 1, according to one or more embodiments;

To facilitate understanding, identical reference numerals have been used, where possible, to designate identical elements that are common to the figures. It is contemplated that elements and features of one embodiment may be beneficially incorporated in other embodiments without further recitation;

Figure 2E:
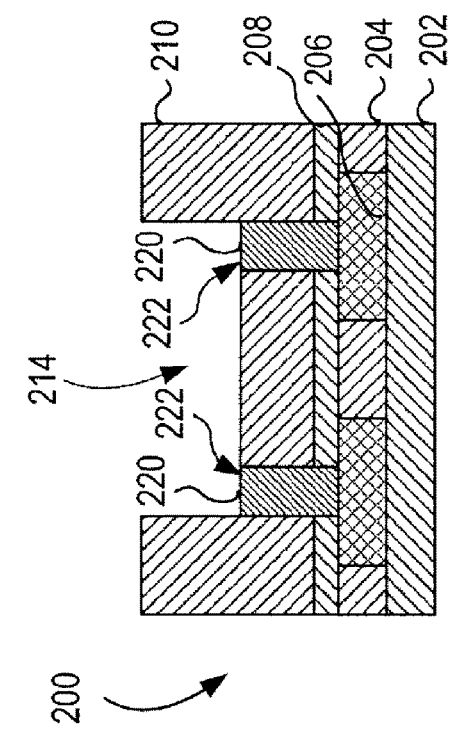

It is to be noted, however, that the appended drawings illustrate only exemplary embodiments of this invention and are therefore not to be considered limiting of its scope, for the invention may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

FIG. 1 is a flow diagram that illustrates one embodiment of a method 100 for forming an interconnect on a substrate. FIGS. 2A-2G illustrate cross-sectional views of the substrate prior to, and at different stages of, the method 100 of FIG. 1.

FIG. 2A illustrates a cross-sectional view of an interconnect 200 prior to commencement of method 100. Generally, the interconnect 200 includes multiple film layers that may be utilized to form an interconnect structure, such as a dual damascene structures. A film stack 201 is formed on a substrate 202. The stack 201 includes a dielectric layer 204. The dielectric layer 204, as shown in FIG. 2A, is disposed on the substrate 202 and has a conductive layer 206 formed in, and bounded by, the dielectric layer 204. In one example, the dielectric layer 204 may be formed from one or more insulating materials such as silicon oxide. In one example, the conductive layer 206 may be formed from a conductive layer, such as copper.

At block 102, a dielectric barrier layer 208 is deposited on the substrate 202, as illustrated in FIG. 2B. For example, as illustrated, the dielectric barrier layer 208 is deposited over both the dielectric layer 204 and the conductive layer 206. Accordingly, the dielectric barrier layer 208 may be formed a uniform, uninterrupted, layer over the dielectric layer 204 and the conductive layer 206. The dielectric barrier layer 208 may be formed from a low-k material. For example, the dielectric barrier layer 208 may be formed from a carbon containing silicon layer (SiC), a nitrogen doped carbon containing silicon layer (SiCN), a silicon nitride layer, a metal nitride or metal oxide (e.g., AlN, AlOx, AlON), or the like.

At block 104, an dielectric layer 210 is deposited on the substrate 202, as illustrated in FIG. 2C. For example, as illustrated, the dielectric layer 210 is deposited over the dielectric barrier layer 208. The dielectric layer 210 may be substantially similar to the dielectric layer 204. In one embodiment, the dielectric layer 210 may be formed from the same material as the dielectric layer 204. In another embodiment, the dielectric layer 210 may be formed from a different material than the dielectric layer 204, while maintaining the same low-k properties.

At block 106, one or more vias 212 are formed in the interconnect 200 to expose the conductive layer 206, as illustrated in FIG. 2D. For example, the vias 212 may be formed through both the dielectric layer 210 and the dielectric barrier layer 208 to expose the underlying conductive layer 206. Generally, the vias 212 have a width, W1. In some embodiments, the width of each via 212 is uniform an entire length of the via 212. In other embodiments, the width of each via 212 may change gradually from a top of the via 212 to a bottom of the via 212.

At block 108, one or more trenches 214 are formed in the interconnect 200, as illustrated in FIG. 2E. The one or more trenches 214 may be formed in the dielectric layer 210. The trenches 214 are configured to widen at least a portion of the via 212. In some embodiments, block 108 may be performed prior to block 106, i.e., the trenches 214 may be formed before the vias 212. In other embodiments, such as the one being described, the trenches 214 are formed subsequent to the forming of the vias 212.

In traditional fabrication schemes, a "fill process" is performed to fill the via 212 and trench 214 are filled with a metal material to form the interconnect 200. For example, a metal, such as copper, may be used to fill both the via 212 and the trench 214. It has been found that filling both the via 212 and the trench 214 with the same material leads to a high interconnect resistance, which may lead to an RC delay and IR drop in semiconductor chips.

Interconnect resistance on chip influences the chip speed as a result of RC delay and power management by IR drop. As design rules continually shrink, interconnect resistance reduction becomes an increasingly important priority. In particular, via (e.g., via 212) resistance weighs significantly on the overall resistance with short interconnect lines, smaller via dimension below 40 nm, and multiple layer routings with via stack, i.e. there is a higher resistance through the via than there is through the lines. Therefore, reducing via resistance has become increasingly important to achieve chip performance.

Conventional via formation leads to a high resistance due to the materials used in process integration. After block 108, in conventional methods, via fill is completed with metal barrier, liner, and bulk filling metal. Metal barrier and liner are used for reliability and gap-fill robustness. However, the materials used for the barrier and liner layer, as a result of their high resistivities, may lead to a high via resistance when deposited at via bottom. As an example, the conventional dual-damascene copper fill may consist of a TaN barrier layer (deposited through a physical vapor deposition (PVD) process, a Ta metal liner layer deposited on the barrier layer (e.g., PVD or chemical vapor deposition (CVD) process), and a Cu seed/plating layer deposited on the metal liner layer. The barrier and liner weigh is more than about 50%-90% of total via resistance, depending on the via dimension. Thus, removal of the metal barrier and the liner layers may aid in reducing via resistance. At the same time, however, potential risks may occur as a result of eliminating the barrier and liner layer. For example, the interconnect will still need to meet reliability aspects, including avoidance of dielectric breakdown and metal electromigration. Additionally, a suitable metal fill process integration in the dual damascene structure may be needed to improve both via resistance and line resistance.

As such, the following discussion proposes a selective fill approach (e.g., a W fill approach), which demonstrates a lower via resistance and simultaneously meets integration and reliability requirements. An interface treatment (discussed below in conjunction with at least block 110) and fill process (discussed below in conjunction with at least block 118) are developed to selectively grow a metal material (e.g., W) from a via bottom without damaging an underlying metal layer (e.g., Cu, W, Co, and the like) and surrounding dielectrics (e.g., low-k dielectrics, oxides, and the like). As a result, the below discussion provides one or more techniques to lower via resistance. Following the via fill, a damascene fill will follow, which aids in forming an equivalent line resistance.

The improved method 100 includes using a selective metal via fill to reduce resistance and meet reliability (interaction with sidewall dielectrics 204 and exposed conductive layer 206) and line resistance requirements. At block 110, one or more pre-treatment processes are performed on the interconnect 200 to prepare the interconnect 200 to receive a selective metal via 212 fill. For example, block 110 may include sub-blocks 112-116.

At sub-block 112, the interconnect 200 undergoes a first treatment process for the exposed portion of the conductive layer 206 in the via 212. For example, the first pretreatment process is used to prepare the exposed portion of the conductive layer 206 for a bottom-up growth when the via 212 is deposited with a first metal. A remote plasma clean process may be used to pre-treat the interconnect. The interconnect 200 may be transferred to a pre-treatment chamber where the interconnect 200 undergoes a cleaning process. For example, the interconnect may undergo a cleaning process between about 250-350° C., using an $H_2$/Ar mixture, at a temperature of about 1-10 Torr. In other embodiments, a slight bias energy may be applied to facilitate oxide knock-off without metal sputtering. For example, an energy of 0-200 W may be applied to the pre-treatment chamber.

At sub-block 114, the interconnect 200 undergoes a second pre-treatment process. The second treatment process is used to passivate sidewalls 216 of the via to minimize undesirable sidewall growth. As mentioned above, the dielectric layer 204 may be formed from a low-k material. As such, the second pre-treatment process aids in sealing surface pores of the dielectric layer 204, and protect the dielectric layer 204 from soaking precursors. In one embodiment, the second pre-treatment process may be a thermal precursor soak at elevated temperatures (e.g., 200-400° C.). In some examples, the precursors that may be used are tetramethylsilane (TMS), dimethylaminotrimethylsilane (DMATMS), and the like. In one embodiment, the second pre-treatment process in sub-block 114 may further include adding ultra-violet (UV) energy to the precursor soaking process, by subjecting the interconnect 200 to a UV baking process.

In some embodiments, block 110 may include sub-block 116. At block 116, the interconnect 200 undergoes an optional post-treatment clean. For example, the optional pre-treatment clean may be used in case of oxidation or residue growth at a bottom of the via 212. The optional pre-treatment clean uses a peroxide (e.g., $H_2O_2$) containing chemistry with alkaline pH tuning to slightly strip away the residue.

Figure 2F:
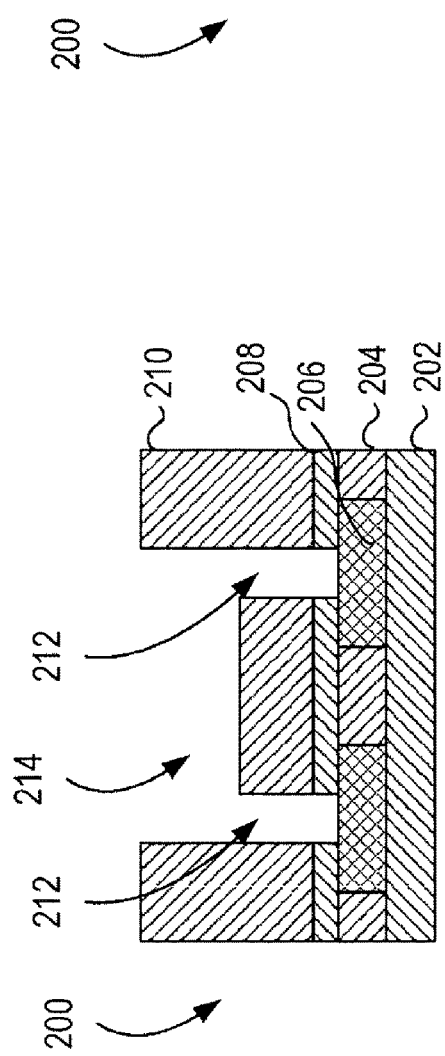

At block 118, following the pre-treatment process (block 110), a metal 220 selectively fills the via 212, as illustrated in FIG. 2F. For example, the metal 220 material is deposited in the via 212 up to a point 222 where the via 212 meets the trench 214. The metal 220 used may be any suitable metal material such as ruthenium (Ru), tungsten (W), cobalt (Co), aluminum (Al), copper (Cu), or the like. The main requirement for the metal 220 is that it is a different material as the subsequent metal deposited in the trench 214. Selectively depositing the metal 220 in the via aids in reducing the via resistance, and meeting reliability and line resistance requirements.

The metal 220 may be deposited using a chemical vapor deposition (CVD) process. The CVD process may include an $H_2$ pre-soak at elevated temperatures (e.g., 350-500° C.). The CVD process may be performed at temperatures of about 200-500° C., using a low flow rate (e.g., 2-100 sccm) of a metal-containing precursor (e.g., $WF_6$) in a vast $H_2$ ambient environment. The combination of flow rate, pressure, and temperature aids in reducing morphology of the metal 220 when deposited. Prior to the metal 220 material being deposited, a conventional nucleation layer may be applied for the initial 1-3 nm of nucleation. The overall growth amount is controlled by process time, pressure, and precursor flow to uniformly fill the via 212.

Figure 2G:
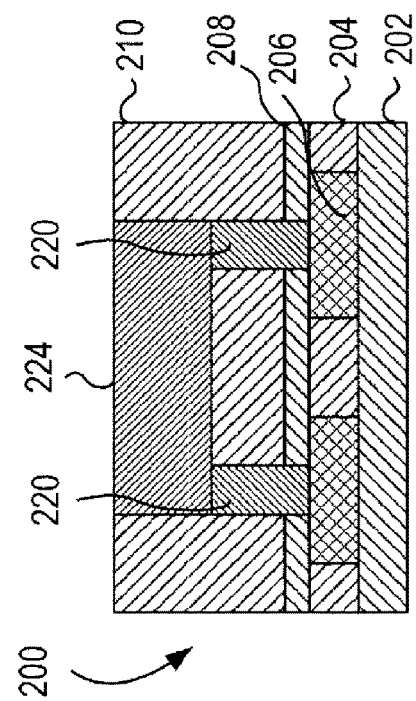

At block 120, a second metal 224 is deposited in each trench 214, as illustrated in FIG. 2G. For example, the second metal 224 is deposited from the point 222 to a top of the trench 214. The second metal 224 used may be any suitable metal material such as ruthenium (Ru), tungsten (W), cobalt (Co), aluminum (Al), copper (Cu), and the like. The main requirement for second metal 224 is that it is a different material as the first metal 220 material deposited in the via 212. The second metal 224 may be deposited using a CVD process. Bifurcating the conventional metal fill of a singular metal material into a two-step process involving a first metal 220 deposited in the via 212, and a second metal 224 deposited in the trench 214 aids in decreasing the resistance through the via 212.

In some embodiments, a barrier seed layer (not shown) may be deposited over the first metal 220 prior to deposition of the second metal 224. For example, provided that the second metal 224 is copper, the barrier seed layer may be a copper barrier seed layer.

In some embodiments, method 100 may include an optional block 119, performed prior to deposition of the second metal 224. At block 119, the interconnect 200 may undergo a pre-treatment process prior to the second metal 224. The pre-treatment process may be used to remove any oxide that may have been formed on a top surface of the first metal 220. For example, the interconnect 200 may undergo a process similar to sub-block 112.

Figure 3:
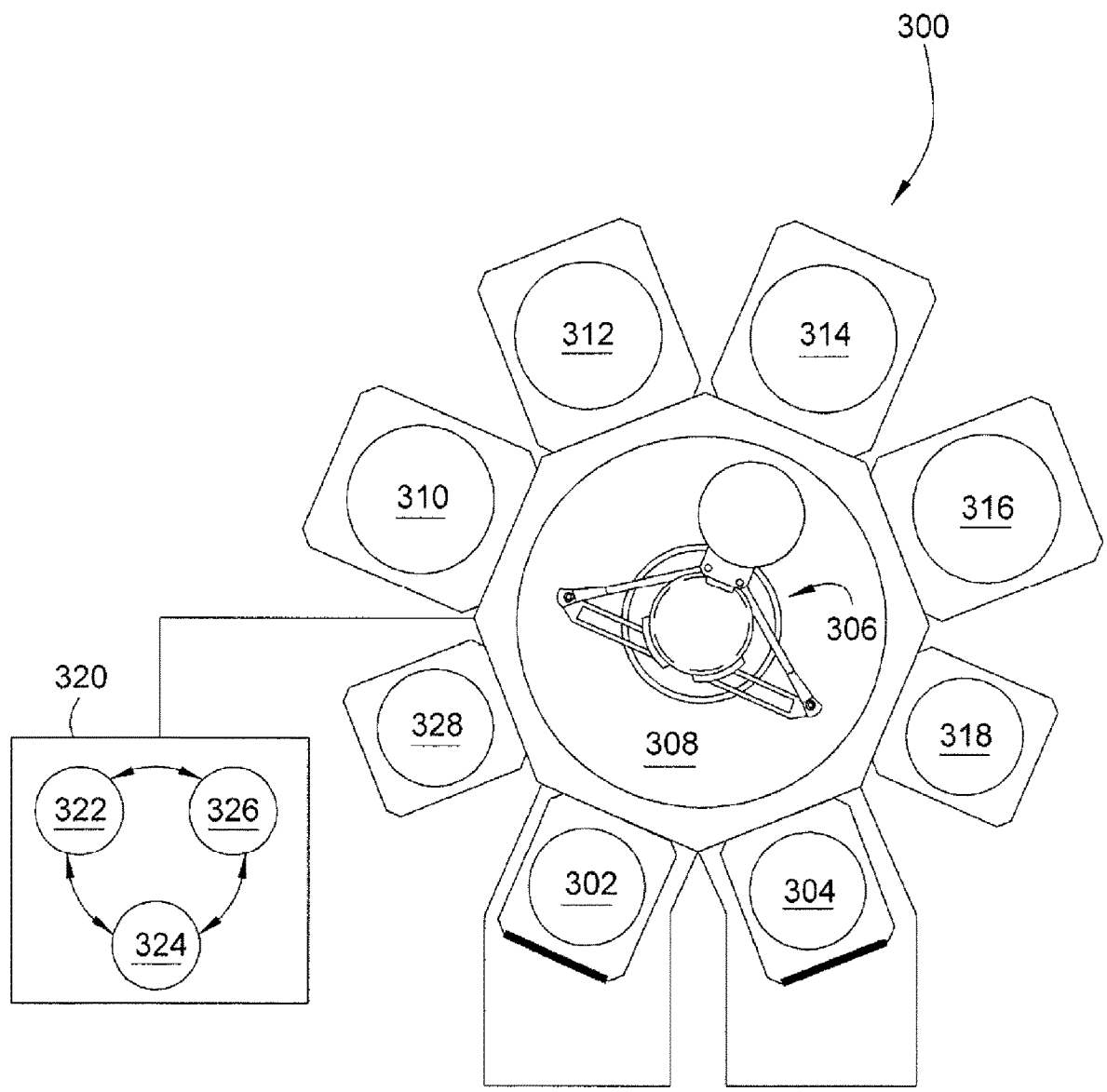
FIG. 3 illustrates a multi-chamber processing system on which the method of FIG. 1 can be practiced, according to one or more embodiments.

FIG. 3 illustrates a multi-chamber processing system 300. The processing system 300 may include load lock chambers 302, 304, a robot 306, a transfer chamber 308, processing chambers 310, 312, 314, 316, 318, 328, and a controller 320. The load lock chambers 302, 304 allow for the transfer of substrates (not shown) into and out of the processing system 300. Load lock chambers 302, 304 may pump down the substrates introduced into the processing system 300 to maintain a vacuum seal. The robot 306 may transfer the substrates between load lock chambers 302, 304 and the processing chambers 310, 312, 314, 316, 318, and 328. The robot 306 may also transfer the substrates between the load lock chambers 302, 304 and the transfer chamber 308.

Each processing chamber 310, 312, 314, 316, 318, and 328 may be outfitted to perform a number of substrate operations such as atomic layer deposition (ALD), chemical vapor deposition (CVD), PVD, etch, pre-clean, de-gas, heat, orientation, or other substrate processes. Additionally, each processing chamber 310, 312, 314, 316, 318, and 328 may be outfitted to deposit a dielectric barrier layer, deposit a dielectric layer, form one or more vias and trenches in the stack, perform one or more pre-clean processes, deposit the first metal material layer, and deposit the second metal material layer.

The controller 320 may be configured to operate all aspects of the processing system 300, such as the method disclosed in FIG. 1. For example, the controller 320 may be configured to control the method of forming an interconnect on a substrate. The controller 320 includes a programmable central processing unit (CPU) 322 that is operable with a memory 324 and a mass storage device, an input control unit, and a display unit (not shown), such as power supplies, clocks, cache, input/output (I/O) circuits, and the liner, coupled to the various components of the processing system to facilitate control of the substrate processing. The controller 320 also includes hardware for monitoring substrate processing through sensors in the processing system 300, including sensors monitoring the precursor, process gas, and purge gas flow. Other sensors that measure system parameters, such as substrate temperature, chamber atmosphere pressure, and the like, may also provide information to the controller 320.

To facilitate control of the processing system 300 described above, the CPU 322 may be one of any form of general purpose computer processor that can be used in an industrial setting, such as a programmable logic controller (PLC), for controlling various chambers and sub-processors. The memory 324 is coupled to the CPU 322 and the memory 324 is non-transitory and may be one or more of readily available memory such as random access memory (RAM), read only memory (ROM), floppy disk drive, hard disk, or any other form of digital storage, local or remote. Support circuits 326 are coupled to the CPU 322 for supporting the processor in a conventional manner. Charged species generation, heating, and other processes are generally stored in the memory 324, typically as software routine. The software routine may also be stored and/or executed by a second CPU (not shown) that is remotely located from the hardware being controlled by the CPU 322.

The memory 324 is in the form of computer-readable storage media that contains instructions, that when executed by the CPU 322, facilitates the operation of the processing system 300. The instructions in the memory 324 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The method discussed above may not be tied solely to the processing system 300. For example, one or more blocks, such as block 120 or sub-block 114, may be performed in a processing chamber exterior to the processing system 300.

One or more embodiments of the disclosure are directed to low temperature methods for depositing tungsten. Some embodiments of the disclosure selectively deposit tungsten on a metal surface over a dielectric surface.

Some embodiments to the disclosure advantageously provide methods of depositing tungsten which provide films with lower roughness, lower stress, and/or lower impurities. Some embodiments of the disclosure provide methods of depositing tungsten which are performed at lower temperatures to facilitate applications which require a low thermal budget.

A method for depositing tungsten is disclosed herein. In some embodiments, the methods disclosed herein correspond to block 118 described above. In some embodiments, the tungsten deposited by the methods disclosed herein correspond to the metal 220 described above.

An exemplary method comprises exposing a substrate to a flow of hydrogen gas ($H_2$) and exposing the substrate to a flow of a tungsten precursor while exposing the substrate to the flow of hydrogen gas.

In some embodiments, the flow of hydrogen gas and the flow of the tungsten precursor are both continuous. The continuous flow of both the hydrogen gas and the tungsten precursor should be understood by the skilled artisan to correspond to a chemical vapor deposition (CVD) process. In some embodiments, the flow of the tungsten precursor is pulsed and the flow of the hydrogen gas is continuous. The pulsed flow of the tungsten precursor and the continuous flow of hydrogen gas should be understood by the skilled artisan to correspond to a pulsed CVD process.

As described above, in some embodiments, the method may begin with a thermal soak of the substrate in a hydrogen ($H_2$) environment. In some embodiments, the thermal soak in a hydrogen environment may be performed after depositing the tungsten. In some embodiments, the method comprises depositing a first amount of tungsten, performing a thermal soak and depositing a second amount of tungsten. In some embodiments, the thermal soak is performed at a temperature in a range of about 250° C. to about 600° C., in a range of about 300° C. to about 500° C., in a range of about 300° C. to about 400° C., or in a range of about 400° C. to about 500° C.

In some embodiments, the methods disclosed herein are performed at a relatively low temperature. As described above, in some embodiments, the substrate is maintained at a temperature in a range of about 200° C. to about 500° C. In some embodiments, In some embodiments, the substrate is maintained at a temperature in a range of about 200° C. to about 400° C., in a range of about 250° C. to about 375° C., in a range of about 300° C. to about 350° C., or in a range of about 250° C. to about 350° C. In some embodiments, the substrate is maintained at a temperature less than or equal to about 400° C., less than or equal to about 375° C., less than or equal to about 350° C., less than or equal to about 325° C., or less than or equal to about 300° C.

In some embodiments, the flow rate of the hydrogen gas and/or the tungsten precursor are controlled. In some embodiments, the flow rate of the hydrogen gas is in a range of about 2000 sccm to about 20000 sccm, in a range of about 2000 sccm to about 18000 sccm, in a range of about 5000 sccm to about 20000 sccm, or in a range of about 10000 sccm to about 20000 sccm. In some embodiments, the flow rate of the tungsten precursor is less than or equal to about 500 sccm, less than or equal to about 200 sccm, less than or equal to about 100 sccm, or less than or equal to about 50 sccm.

In some embodiments, the ratio between the flow rate of the hydrogen gas and the flow rate of the tungsten precursor is controlled. In some embodiments, the ratio of the flow rate of the hydrogen gas to the flow rate of the tungsten precursor is greater than or equal to about 100:1, greater than or equal to about 200:1, greater than or equal to about 500:1, or greater than or equal to about 1,000:1, greater than or equal to about 5,000:1, or greater than or equal to about 10,000:1, Without being bound by theory, it is believed that the beneficial results (low roughness, low stress, etc.) in the tungsten film are due to the surplus of hydrogen present within the processing chamber.

In some embodiments, the pressure of the processing chamber is controlled. In some embodiments, the pressure of the chamber is maintained in a range of about 5 Torr to about 50 Torr, in a range of about 10 Torr to about 50 Torr, in a range of about 20 Torr to about 50 Torr, in a range of about 5 Torr to about 20 Torr, or in a range of about 5 Torr to about 10 Torr. In some embodiments, the pressure is maintained at less than or equal to about 50 Torr.

The tungsten precursor may be any suitable precursor for depositing a tungsten film. In some embodiments, the tungsten precursor comprises a reactive tungsten species and a carrier gas. In some embodiments, the tungsten precursor comprises a reactive tungsten complex and a carrier gas. In some embodiments, the tungsten precursor comprises one or more of $WF_6$, $W_xCl_{5x}$, $WCl_6$, or $W(CO)_6$.

In some embodiments, the tungsten precursor comprises or consists essentially of $WF_6$. As used in this regard, the tungsten precursor consists essentially of $WF_6$ when greater than or equal to about 95%, greater than or equal to about 98%, greater than or equal to about 99%, or greater than or equal to about 99.5% of the reactive tungsten species on a molar basis, excluding any carrier gas.

In some embodiments, the tungsten deposited by the disclosed methods has a relatively low level of impurities. In those embodiments where the tungsten precursor comprises $WF_6$, the deposited tungsten has a fluorine content of less than or equal to about $10^{20}$ atoms/cm$^3$, less than or equal to about $5\times10^{19}$ atoms/cm$^3$, less than or equal to about $10^{19}$ atoms/cm$^3$, less than or equal to about $5\times10^{18}$ atoms/cm$^3$, or less than or equal to about $10^{18}$ atoms/cm$^3$.

In some embodiments, the surface roughness of deposited tungsten is relatively low. In some embodiments, the root mean squared roughness of the deposited tungsten is less than or equal to about 2 nm, less than or equal to about 1.5 nm, less than or equal to about 1 nm, or less than or equal to about 0.5 nm.

In some embodiments, the stress of the deposited tungsten is relatively low. In some embodiments, the stress of the deposited tungsten is less than or equal to about 2000 MPa, less than or equal to about 1500 MPa, less than or equal to about 1200 MPa, less than or equal to about 1000 MPa, less than or equal to about 800 MPa, less than or equal to about 500 MPa, or less than or equal to about 200 MPa.

In some embodiments, the substrate comprises multiple exposed materials. In some embodiments, the substrate comprises a first material surface and a second material surface. As identified above, the first material surface may comprise a metal or metal alloy. In some embodiments, the metal is selected from one or more of copper, tungsten, cobalt or ruthenium. Further, the second material surface may comprise one or more of a low-k dielectric, oxides, silicon nitride, silicon oxynitride and the like.

In some embodiments, the methods described herein selectively deposit tungsten on the first material surface over the second material surface. Stated differently, in some embodiments, a first thickness of tungsten is deposited on the first material surface and a second thickness of tungsten is deposited on the second material surface. The first thickness is greater than the second thickness. In some embodiments, a ratio of the first thickness to the second thickness is greater than or equal to about 100:1, greater than or equal to about 200:1, greater than or equal to about 250:1, greater than or equal to about 500:1, greater than or equal to about 700:1, or greater than or equal to about 1,000:1.

While the foregoing is directed to embodiments of the present invention, other and further embodiments of the invention may be devised without departing from the basic scope thereof, and the scope thereof is determined by the claims that follow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing tungsten, the method comprising:
    exposing a substrate to a continuous flow of hydrogen gas; and
    exposing the substrate to a pulsed flow of a tungsten precursor while exposing the substrate to the continuous flow of hydrogen gas to deposit a tungsten layer on the substrate, wherein the substrate is maintained at a temperature of less than or equal to about 350° C.

2. The method of claim 1, wherein a ratio of the flow of hydrogen gas to the flow of the tungsten precursor is greater than or equal to about 500:1.

3. The method of claim 1, wherein the tungsten layer has a root mean squared roughness of less than or equal to about 1 nm.

4. The method of claim 1, wherein the stress of the tungsten layer is less than or equal to about 1000 MPa.

5. The method of claim 1, wherein the tungsten precursor comprises $WF_6$.

6. The method of claim 4, wherein the tungsten layer has a fluorine concentration of less than or equal to about $10^{19}$ atoms/cm$^3$.

7. A method of depositing tungsten, the method comprising:
- exposing a substrate to a flow of hydrogen gas; and
- exposing the substrate to a flow of a tungsten precursor while exposing the substrate to the flow of hydrogen gas, wherein a ratio of the flow of hydrogen gas to the flow of the tungsten precursor is greater than or equal to about 500:1.

8. The method of claim 7, wherein the flow of hydrogen gas and the flow of the tungsten precursor are both continuous.

9. The method of claim 7, wherein the flow of the tungsten precursor is pulsed and the flow of hydrogen gas is continuous.

10. The method of claim 7, wherein the tungsten layer has a root mean squared roughness of less than or equal to about 1 nm.

11. The method of claim 7, wherein the stress of the tungsten layer is less than or equal to about 1000 MPa.

12. The method of claim 7, wherein the tungsten precursor comprises $WF_6$.

13. The method of claim 12, wherein the tungsten layer has a fluorine concentration of less than or equal to about $10^{19}$ atoms/cm$^3$.

14. A method of selectively depositing tungsten, the method comprising:
- exposing a substrate comprising a first material surface and a second material surface to a flow of hydrogen gas; and
- exposing the substrate to a flow of a tungsten precursor while exposing the substrate to the flow of hydrogen gas to deposit a first thickness of tungsten on the first material surface and a second thickness of tungsten on the second material surface, a ratio of the first thickness to the second thickness is greater than or equal to about 200:1.

15. The method of claim 14, wherein the substrate is maintained at a temperature of less than or equal to about 350° C.

16. The method of claim 14, wherein a ratio of the flow of hydrogen gas to the flow of the tungsten precursor is greater than or equal to about 500:1.

17. The method of claim 14, wherein the flow of hydrogen gas and the flow of the tungsten precursor are both continuous.

18. The method of claim 14, wherein the flow of the tungsten precursor is pulsed and the flow of hydrogen gas is continuous.

* * * * *